United States Patent
Kanematsu et al.

(10) Patent No.: US 8,797,782 B2
(45) Date of Patent: Aug. 5, 2014

(54) SEMICONDUCTOR DEVICE AND OPERATION METHOD THEREOF

(75) Inventors: Shigeru Kanematsu, Kanagawa (JP); Yuki Yanagisawa, Kanagawa (JP); Matsuo Iwasaki, Nagasaki (JP)

(73) Assignee: Sony Corporation, Tokyo (JP)

( * ) Notice: Subject to any disclaimer, the term of this patent is extended or adjusted under 35 U.S.C. 154(b) by 253 days.

(21) Appl. No.: 13/396,091

(22) Filed: Feb. 14, 2012

(65) Prior Publication Data

US 2012/0212992 A1 Aug. 23, 2012

(30) Foreign Application Priority Data

Feb. 21, 2011 (JP) ................................. 2011-034796

(51) Int. Cl.
*G11C 17/00* (2006.01)
(52) U.S. Cl.
USPC .............................. 365/104; 365/103; 365/96
(58) Field of Classification Search
CPC ................................ G11C 17/16; G11C 17/18
USPC ........................................... 365/96, 103, 104
See application file for complete search history.

(56) References Cited

U.S. PATENT DOCUMENTS

| 5,019,878 A * | 5/1991 | Yang et al. ..................... 257/390 |
| 7,161,218 B2 * | 1/2007 | Bertin et al. ................... 257/415 |
| 7,333,356 B2 * | 2/2008 | Reiner .......................... 365/104 |
| 7,573,118 B2 * | 8/2009 | Kushida ........................ 257/529 |
| 7,911,831 B2 * | 3/2011 | Rueckes et al. ................ 365/164 |
| 2012/0212991 A1 * | 8/2012 | Kanematsu et al. .......... 365/103 |

FOREIGN PATENT DOCUMENTS

JP 2006-510203 3/2006

* cited by examiner

*Primary Examiner* — Harry W Byrne
*Assistant Examiner* — Lance Reidlinger
(74) *Attorney, Agent, or Firm* — Dentons US LLP

(57) ABSTRACT

An operation method of a semiconductor device, includes providing one or more memory elements each including a first semiconductor layer, second and third semiconductor layers, a dielectric film and a conductive film, a first electrode, a second electrode, and a third electrode, and performing operation of writing information on a memory element to be driven of the one or more memory elements. The operation of writing is performed by forming a filament in a region between the second and third semiconductor layers, which is a conductive path electrically linking these semiconductor layers, the filament being formed by causing a dielectric breakdown of at least a part of the dielectric film, through application of a voltage equal to or higher than a predetermined threshold between the second and third electrodes, thereby causing an electric current to flow between the conductive film and the third semiconductor layer.

12 Claims, 9 Drawing Sheets

PRIOR ART

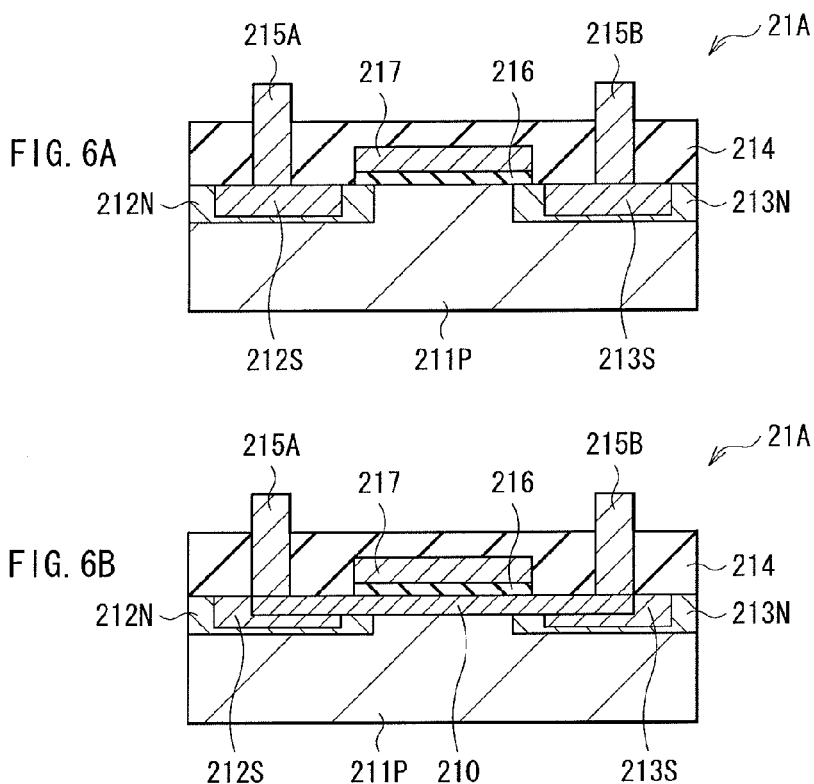
FIG. 6A
FIG. 6B
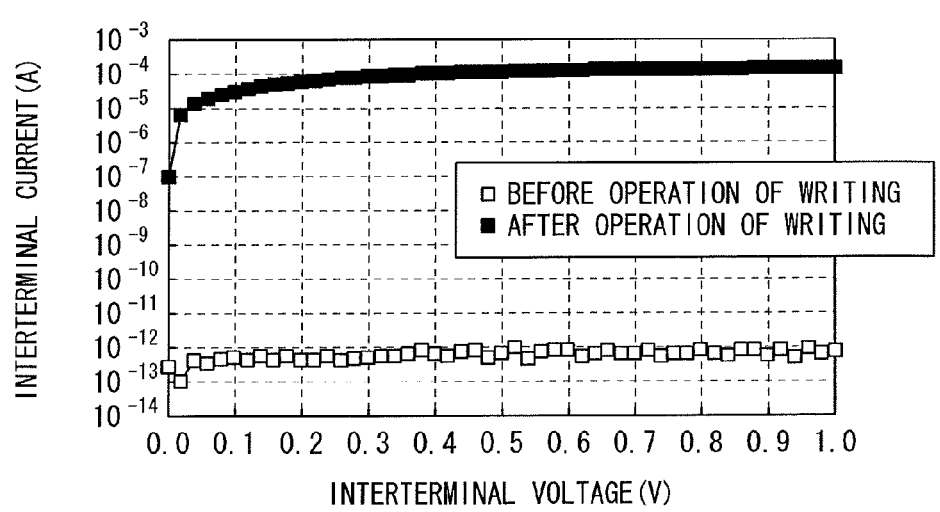
FIG. 7

BEFORE OPERATION OF WRITING

AFTER OPERATION OF WRITING

SEMICONDUCTOR DEVICE AND OPERATION METHOD THEREOF

BACKGROUND

The present disclosure relates to a semiconductor device with a memory element suitable for serving as a One-Time Programmable (OTP) element, and an operation method of such a semiconductor device.

An OTP element is a nonvolatile memory element that may save information even when the power of a device is turned off, and some structures of fuse type, anti-fuse type, and the like have been suggested.

In a fuse type OTP element, for example, a resistor is fused by feeding a large current to a resistance element made of polycrystalline silicon or the like, causing a change from a short (short-circuit) state to an open (open-circuit) state between both electrodes, and thereby information writing operation is performed. On the other hand, in an anti-fuse type OTP element, for example, a dielectric breakdown of a dielectric film is caused by application of a voltage equal to or higher than a dielectric voltage to a Metal Oxide Semiconductor (MOS) type capacitive element, and thereby the state between both electrodes is changed from a short state to an open state. In other words, in this anti-fuse type OTP element, information writing operation is performed by allowing the state between both electrodes to be changed from the short state to the open state.

Further, for example, Japanese Unexamined Patent Application Publication (Published Japanese Translation of PCT Application) No. JP2006-510203 proposes an anti-fuse type OTP element using a technique different from the one described above.

SUMMARY

The OTP element of Japanese Unexamined Patent Application Publication No. JP2006-510203 mentioned above uses a snapback phenomenon in a MOS transistor. This snapback phenomenon is a phenomenon in which when a transistor is caused to be in an ON state by applying a predetermined voltage (gate voltage) to a gate and then the gate voltage is lowered, strong pinch off is forcibly caused, and a large current flows between a source and a drain with a voltage lower than a withstand voltage of an ordinary MOS transistor. In the OTP element of Japanese Unexamined Patent Application Publication No. JP2006-510203, a PN junction is destroyed by a large current flowing at the time of this snapback phenomenon, and, as a result, a short is caused between the source and the drain. In other words, in a manner similar to the typical anti-fuse OTP element described above, information writing operation is performed by allowing the state between both electrodes to be changed from a short state to an open state in this OTP element as well.

Incidentally, in the typical fuse-type OTP element described above, it is desirable to feed a large current at the time of the writing operation for the purpose of fusing the resistor. Therefore, a transistor with a high current capability which allows a large current to flow and a wire which is wide enough to pass a large current are desired, thereby increasing the area of the whole circuit including a peripheral part for the writing operation. In addition, it is desirable that the OTP element itself be enlarged as compared to the element size of an ordinary transistor, which also leads to a disadvantage in terms of area when the bit count in a memory device is increased.

On the other hand, in the typical anti-fuse type OTP element described above, it is desirable to apply a high voltage in order to cause the dielectric breakdown of the dielectric film. The high voltage is on a level of exceeding the withstand voltage of an ordinary MOS transistor in which the dielectric film serves as a gate insulator and thus, it is desirable to provide a transistor of a higher withstand voltage in order to perform the writing operation for the OTP element. Therefore, still, an increase in the area of a memory device is caused, or an increase in the production process results.

In contrast, in the OTP element of Japanese Unexamined Patent Application Publication No. JP2006-510203 described above, since the PN junction is destroyed by the large current flowing at the time of the snapback phenomenon, the large current also flows in a transistor (selection transistor) to select the OTP element to be driven (targeted for the writing operation). Here, in this technique, as described earlier, the large current is made to flow by allowing a state to be changed from a state in which the electric current flows in both of the OTP element and the selection transistor (the ON state) to a snapback mode by lowering the gate voltage of the OTP element. For this reason, there is such a concern that when the resistance value of the selection transistor at the time of the first ON state is large, the voltage between both ends of the OTP element falls due to a voltage drop. Therefore, in the selection transistor, it is desirable to lower the resistance value by, for example, setting a large width (gate width) of a channel region. This leads to an increase in the element size of the selection transistor.

In addition, this selection transistor is used to select the OTP element targeted for reading at the time of operation of reading after the writing operation and thus, destruction of the selection transistor at the time of the writing operation is not acceptable. Therefore, the selection transistor is desired to have a current capability high enough to allow in the ON state a sufficient flow of an electric current flowing at the time of the writing operation, and it is desirable to make the element size of the selection transistor larger than the OTP element in this respect as well.

Because of these, in the OTP element of Japanese Unexamined Patent Application Publication No. JP2006-510203, although the OTP element may be made in about the same element size as an ordinary MOS transistor, the selection transistor used as being paired with the OTP element is of an element size larger than the OTP element. As a result, a memory cell (a so-called "1T1R" type memory cell) per bit as a whole leads to an increase in the element area.

In this way, in a semiconductor device with a typical memory element (OTP element), it has been difficult to reduce the area, and making a suggestion about a technique to improve this situation has been expected.

In view of the foregoing, it is desirable to provide a semiconductor device making it possible to reduce the area, and an operation method thereof.

According to an embodiment of the present disclosure, there is provided an operation method of a semiconductor device, the method including: providing one or more memory elements each including a first semiconductor layer of a first conductivity type, second and third semiconductor layers of a second conductivity type, which are disposed to be separated from each other in the first semiconductor layer, a dielectric film on a lower-layer side and a conductive film on an upper-layer side, which are provided in a region corresponding to a part between the second and third semiconductor layers on the first semiconductor layer, a first electrode electrically connected to the second semiconductor layer, a second electrode electrically connected to the third semiconductor layer, and a third electrode electrically connected to the conductive film; and performing operation of writing information on a memory element to be driven of the one or more memory elements. The operation of writing is performed by forming a filament in a region between the second and third semiconductor layers, which is a conductive path electrically linking these semiconductor layers, the filament being formed by causing a dielectric breakdown of at least a part of the dielectric film, through application of a voltage equal to or higher than a predetermined threshold between the second and third electrodes, thereby causing an electric current to flow between the conductive film and the third semiconductor layer.

In the operation method according to the above-described embodiment, for the memory element to be driven of the one or more memory elements, the operation of writing information is performed by forming the filament in the region between the second and third semiconductor layers, by causing the dielectric breakdown of at least the part of the dielectric film, through application of the voltage equal to or higher than the predetermined threshold between the second and third electrodes, thereby causing the electric current to flow between the conductive film and the third semiconductor layer. This realizes the operation of writing, without making the memory element be of a high withstand voltage, or causing a flow of a large current at the time of the operation of writing.

According to another embodiment of the present disclosure, there is provided a semiconductor device including one or more memory elements. The one or more memory elements each include: a first semiconductor layer of a first conductivity type, second and third semiconductor layers of a second conductivity type which are disposed to be separated from each other in the first semiconductor layer, a dielectric film on a lower-layer side and a conductive film on an upper-layer side which are provided in a region corresponding to a part between the second and third semiconductor layers on the first semiconductor layer, a first electrode electrically connected to the second semiconductor layer, a second electrode electrically connected to the third semiconductor layer, and a third electrode electrically connected to the conductive film. In at least a partial memory element of the one or more memory elements, a dielectric breakdown of at least a part of the dielectric film is caused, and in a region between the second and third semiconductor layers, a filament that is a conductive path electrically linking these semiconductor layers is formed.

In the semiconductor device according to the above-described embodiment, in at least the partial memory element of the one or more memory elements, the dielectric breakdown of at least the part of the dielectric film is caused, and the filament is formed in the region between the second and third semiconductor layers. This realizes, in the partial memory element corresponding to the memory element after the operation of writing information, the operation of writing without making the memory element be of a high withstand voltage, or causing a flow of a large current at the time of the operation of writing.

According to the operation method of the above-described embodiment, for the memory element to be driven among the one or plurality of memory elements, the operation of writing is performed by forming the filament in the region between the second and third semiconductor layers, by causing the dielectric breakdown of at least the part of the dielectric film, through application of the voltage equal to or higher than the predetermined threshold between the second and third electrodes, thereby causing the electric current to flow between the conductive film and the third semiconductor layers. Therefore, it is possible to realize the operation of writing, without making the memory element be of a high withstand voltage, or causing a flow of a large current at the time of the operation of writing. Accordingly, an area in the semiconductor device may be reduced.

According to the semiconductor device of the above-described embodiment, in at least the partial memory element of the one or more memory elements, the dielectric breakdown of at least the part of the dielectric film is caused, and the filament is formed in the region between the second and third semiconductor layers. Therefore, it is possible to realize, in the partial memory element, the operation of writing without making the memory element be of a high withstand voltage, or causing a flow of a large current at the time of the operation of writing. Accordingly, an area in the semiconductor device may be reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 6A and 6B are schematic cross-sectional diagrams each illustrating a configurational example of a memory element (before and after operation of writing) according to a modification 1.

FIG. 7 is a characteristic diagram illustrating an electrical characteristic of a memory element (before and after operation of writing) according to an example of the modification 1.

DETAILED DESCRIPTION OF EMBODIMENT

An embodiment of the present disclosure will be described below in detail with reference to the drawings. Incidentally, the description will be provided in the following order.
1. Embodiment (a basic configurational example: N-type MOS transistor structure)
2. Modifications
    Modification 1 (an example in which a silicide layer is provided)
    Modification 2 (an example in which a memory element and a selection transistor are integrally formed)
    Modification 3 (an example in which a control transistor for controlling a conductive film potential of a memory element is provided)
    Other Modifications Embodiment

Figure 1:
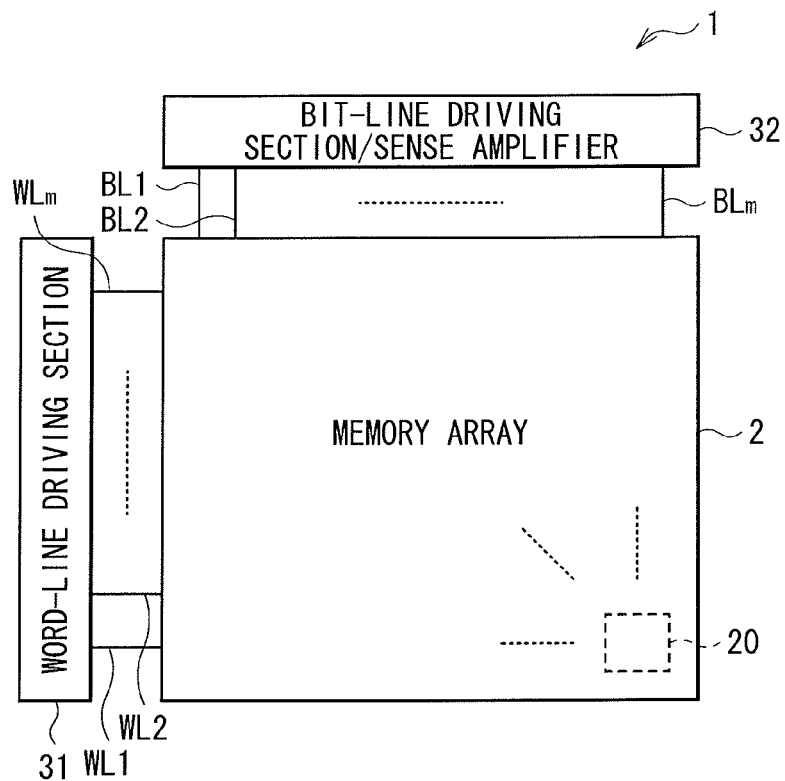
FIG. 1 is a block diagram illustrating a configurational example of a semiconductor device (a memory device) according to an embodiment of the present disclosure.

[Configuration of Memory Device 1]
FIG. 1 is a block diagram of a semiconductor device (a memory device 1) according to an embodiment of the present disclosure. The memory device 1 is a memory device (a so-called OTP ROM (Read Only Memory)) in which information (data) may be written only once, and from which the written information may be read many times, but deletion of the information is disabled. This memory device 1 includes a memory array 2 having more than one memory cell 20, a word-line driving section 31, and a bit-line driving section/sense amplifier 32. Among these, the word-line driving section 31 and the bit-line driving section/sense amplifier 32 correspond to a specific example of "a drive section" (a writing operation section, a programming operation section) of the earlier-described embodiment in the present disclosure.

The word-line driving section 31 applies a predetermined electric potential (a word line potential to be described later) to two or more word lines WL1 to WLm (here, the number of the word lines is m (m: an integer not smaller than 2)) disposed in parallel in a row direction.

The bit-line driving section/sense amplifier 32 applies a predetermined electric potential (a voltage for operation of writing to be described later) to two or more bit lines BL1 to BLm disposed in parallel in a column direction (the number of the bit lines is m). Thus, a predetermined voltage V1 is applied to a memory element 21 to be described later in the memory cell 20, and thereby the operation of writing information which will be described later is performed. This bit-line driving section/sense amplifier 32 also has a function of performing operation of reading information from each of the memory cells 20 by using the above-mentioned m pieces of bit lines BL1 to BLm, as well as performing predetermined signal amplification processing in an internal sense amplifier. It is to be noted that in the following, the bit lines BL1 to BLm will be collectively referred to as a bit line BL as appropriate.

Figure 2:
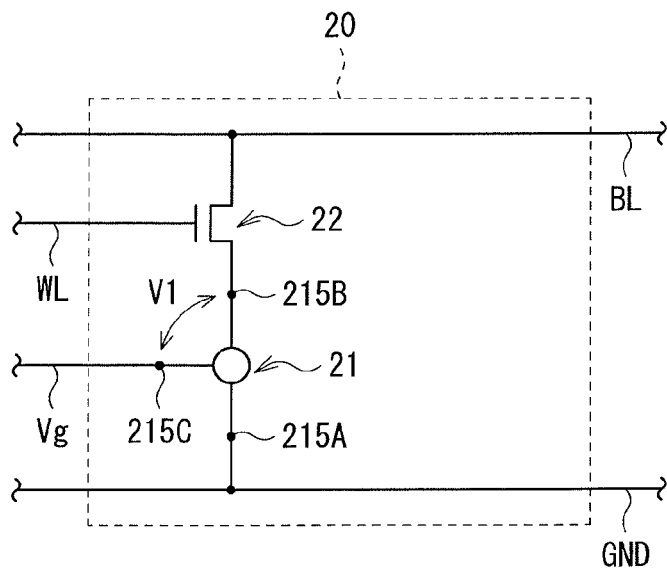
FIG. 2 is a circuit diagram illustrating a configurational example of a memory cell illustrated in FIG. 1.

In this way, the word-line driving section 31 and the bit-line driving section/sense amplifier 32 select the memory cell 20 to be driven (targeted for operation) from the memory cells 20 in the memory array 2, and perform the operation of writing or reading information selectively.
[Configuration of Memory Array 2]
In the memory array 2, the memory cells 20 are disposed in rows and columns (in the form of a matrix) as illustrated in FIG. 1. FIG. 2 illustrates an example of a circuit configuration of the memory cell 20. In this memory array 2, one word line WL and one bit line BL are connected to each of the memory cells 20.

Further, each of the memory cells 20 has one memory element 21 and one selection transistor 22, and is in a so-called "1T1R" type circuit configuration. In this memory cell 20, the word line WL is connected to a gate of the selection transistor 22. The bit line BL is connected to one of a source and a drain of the selection transistor 22, and an electrode 215B (here, a drain electrode) to be described later in the memory element 21 is connected to the other. Furthermore, an electrode 215A (here, a source electrode) to be described later in the memory element 21 is connected to a ground (grounding) GND, and an electrode 215C (a gate electrode) is set at a predetermined electric potential (a gate potential Vg to be described later). In other words, in this memory cell 20, one memory element 21 and one selection transistor 22 are connected to each other in series between the bit line BL and the ground GND.

Figure 3A:
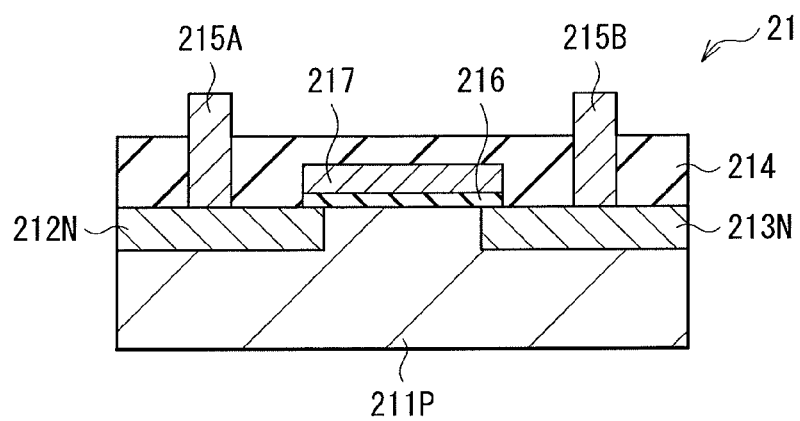
FIGS. 3A and 3B are schematic cross-sectional diagrams each illustrating a configurational example of a memory element (before and after operation of writing) illustrated in FIG. 2.
Figure 3B:
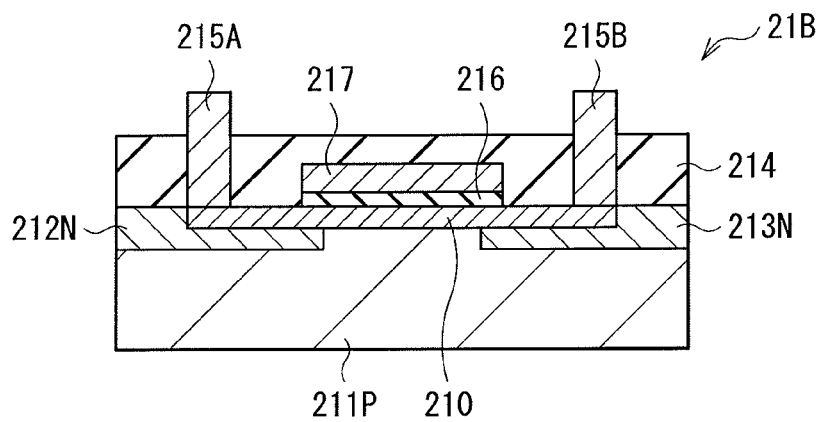

The selection transistor 22 is a transistor to select the memory element 21 to be driven (targeted for the operation of writing or targeted for the operation of reading), and is, for example, a MOS (Metal Oxide Semiconductor) transistor. However, the selection transistor 22 is not limited to this and a transistor with other structure may be used.
[Memory Element 21]
The memory element 21 is an element in which information is stored by the operation of writing to be described later, and is a so-called anti-fuse type OTP element which will be described later in detail. FIGS. 3A and 3B each schematically illustrate an example of a cross-sectional configuration of this memory element 21, and FIG. 3A illustrates the example of the cross-sectional configuration before the operation of writing to be described later, whereas FIG. 3B illustrates the example of the cross-sectional configuration after this operation of writing.

As illustrated in FIG. 3A, the memory element 21 before the operation of writing has a layered structure including semiconductor layers 211P, 212N, and 213N, the three electrodes 215A, 215B, and 215C, an insulating layer 214, a dielectric film 216, and a conductive film 217. It is to be noted that for the electrode 215C, illustration is omitted in FIGS. 3A and 3B (FIGS. 6A and 6B, and FIGS. 11A and 11B to be described later).

The semiconductor layer 211P (the first semiconductor layer) forms, for example, a semiconductor substrate, and is a P-type (the first conductivity type) semiconductor layer. This semiconductor layer 211P is made of, for example, a semiconductor material in which silicon (Si) is doped with an impurity such as boron (B).

The semiconductor layer 212N (the second semiconductor layer) and the semiconductor layer 213N (the third semiconductor layer) are disposed apart from each other with a predetermined gap therebetween in the semiconductor layer 211P, and are each formed of a N-type (the second conductivity type) semiconductor layer (form a so-called N+ layer). These semiconductor layers 212N and 213N are each made of a semiconductor material in which Si is doped with, for example, an impurity such as arsenic (As) or phosphorus (P), and each have a thickness of around 50 to 200 nm. Such semiconductor layers 212N and 213N may be easily formed in a region of the semiconductor layer 211P, with a technique based on self-alignment (self-aligning type) to be described later, or a technique using a mask pattern such as a predetermined photoresist or an oxide film. Here, it is desirable that the distance between these semiconductor layers 212N and 213N be as short as possible (for example, around 50 to 200 nm), because this makes it possible to realize the memory element 21 of a small element size.

The dielectric film 216 is provided in a region corresponding to a part between the semiconductor layers 212N and 213N (here, a region between the semiconductor layers 212N and 213N, and a partial region in these semiconductor layers 212N and 213N), on the semiconductor layer 211P. This dielectric film 216 is made of, for example, an insulating material (a dielectric) similar to a typical gate insulator in a MOS transistor, such as silicon oxide ($SiO_2$), and the thickness is around a few to 20 nm.

The conductive film 217 is provided on a region where the dielectric film 216 is formed, and this forms a layered structure including the dielectric film 216 on a lower-layer side and the conductive film 217 on an upper-layer side. This conductive film 217 is made of, for example, a conductive material such as polycrystalline silicon or silicide metal, and the thickness is around 50 to 500 nm.

The insulating layer 214 is provided to cover the semiconductor layers 212N and 213N and the conductive film 217. This insulating layer 214 is made of, for example, an insulating material such as $SiO_2$ or silicon nitride ($SiN_x$), and the thickness is around 50 to 1000 nm.

The electrode 215A (the first electrode) is provided in the insulating layer 214 to be electrically connected to the semiconductor layer 212N on the semiconductor layer 212N, and this makes it possible to apply a predetermined electric potential (here, a source potential) to the semiconductor layer 212N. Further, the electrode 215B (the second electrode) is provided in the insulating layer 214 to be electrically connected to the semiconductor layer 213N on the semiconductor layer 213N, and this makes it possible to apply a predetermined electric potential (here, a drain potential) to the semiconductor layer 213N. These electrodes 215A and 215B are each made of, for example, a conductive material such as metal including tungsten (W), aluminum (Al), and the like.

The electrode 215C is provided to be electrically connected to the conductive film 217, and this makes it possible to apply a predetermined electric potential (the gate potential Vg to be described later) to the conductive film 217. It is to be noted that, here, the gate length of the memory element 21 defines the distance between the semiconductor layers 212N and 213N separated from each other, but this gate length may not be set at a minimum value (a value determined by a rating and the like) as a MOS transistor. In other words, as long as the semiconductor layers 212N and 213N are separated from each other, formation may not be based on the gate length minimum as a MOS transistor or less.

On the other hand, as illustrated in FIG. 3B, in the memory element 21 after the operation of writing, a filament 210 (a conductive path section) to be described below is formed, in addition to the semiconductor layers 211P, 212N, and 213N, the electrodes 215A, 215B, and 215C, the insulating layer 214, the dielectric film 216, and the conductive film 217 described above.

This filament 210 is formed in a region between the semiconductor layers 212N and 213N via the semiconductor layer 211P, and although details will be described later, the filament 210 functions as a conductive path (a conductive route) connecting these semiconductor layers 212N and 213N (the electrodes 215A and 215B) to each other electrically. In other words, in the memory element 21 illustrated in this FIG. 3B, a short is caused between the semiconductor layers 212N and 213N (in a short state) with a predetermined resistance value (by a resistance component), by the filament 210. Such a filament 210 is formed by movement of one or both of the conductive component of the electrode 215A and the conductive component of the electrode 215B by migration when the voltage V1 equal to or higher than a predetermined threshold is applied between the electrodes 215B and 215C (see FIG. 2). It is to be noted that the principle of the formation of this filament 210 will be described later in detail.

Incidentally, the structure of the memory element 21 illustrated in FIG. 3A may be easily formed by using a technique similar to a process of forming a typical MOS transistor (for example, a process of forming self-aligning source/drain through use of a gate of a MOS transistor as a mask). In that case, the formation may be achieved with a narrow distance between the semiconductor layers 212N and 213N separated from each other, and also with excellent controllability of dimensions.

[Operation and Effects of Memory Device 1]

[1. Basic Operation]

In this memory device 1, as illustrated in FIG. 1 and FIG. 2, the word-line driving section 31 applies the predetermined electric potential (the word line potential) to the m pieces of word lines WL1 to WLm. Further, in conjunction with that, the bit-line driving section/sense amplifier 32 applies the predetermined electric potential (the voltage for the operation of writing) to the m pieces of bit lines BL1 to BLm. As a result, the memory cell 20 to be driven (targeted for the operation of writing) is selected from the memory cells 20 in the memory array 2, and the predetermined voltage V1 to be described later is applied to the memory element 21 therein, and the operation (only once) of writing information is performed selectively.

On the other hand, the bit-line driving section/sense amplifier 32 performs the operation of reading information from the memory element 21 in the memory cell 20 to be driven (targeted for the operation of reading) by using the m pieces of bit lines BL1 to BLm, and also carries out the predetermined signal amplification processing in the internal sense amplifier. Thus, the operation of reading information from the memory element 21 is performed selectively.

Here, when the memory cell 20 (the memory element 21) to be driven (targeted for the operation of writing or targeted for the operation of reading) is selected, the predetermined electric potential (the word line potential) is applied to the word line WL connected to the memory cell 20, and also, the predetermined voltage (the voltage for the operation of writing) is applied to the connected bit line BL. Meanwhile, in the memory cell 20 other than the memory cell 20 to be driven, a ground potential (for example, 0 V) is applied to the connected word line WL, and also, the connected bit line BL is set in a floating state or at the ground potential (0 V). In this way, the operation of writing or the operation of reading is performed after selecting the memory element 21 to be driven by causing the selection transistor 22 in the memory cell 20 to be driven to be in the ON state.

[2. Details of Operation of Writing]

Next, with reference to FIG. 3A to FIG. 5, the operation of writing in the memory device 1, which is one of characteristics of the present disclosure, will be described in detail in comparison with a comparative example.

[2-1. Comparative Example]

Figure 4:
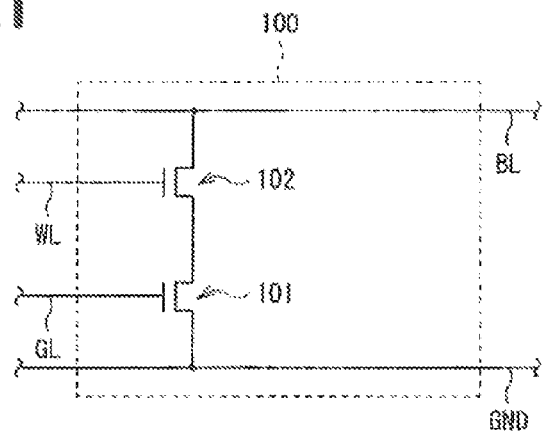
FIG. 4 is a circuit diagram illustrating a configuration of a memory cell in a memory device according to a comparative example.

FIG. 4 illustrates a circuit configuration of a memory cell (a memory cell 100) in a memory device according to the comparative example. The memory cell 100 of this comparative example has one memory element 101 (an OTP element) configured by using a transistor and one selection transistor 102. In this memory cell 100, a word line WL is connected to a gate of the selection transistor 102. A bit line BL is connected to one of a source and a drain in the selection transistor 102, and connected to the other is one of a source and a drain in the memory element 101. Further, in the memory element 101, a ground GND is connected to the other of the source and the drain, and a gate is connected to a gate line GL to which a predetermined gate voltage Vg is applied.

In this memory cell 100, operation of writing information into the memory element 101 is performed using a snapback phenomenon in a MOS transistor. This snapback phenomenon is a phenomenon in which when a transistor is turned to be in an ON state by applying a predetermined voltage (a gate voltage) to a gate and then the gate voltage is lowered, strong pinch off is forcibly caused, and a large current flows between a source and a drain with a voltage lower than the withstand voltage of an ordinary MOS transistor.

Figure 5:
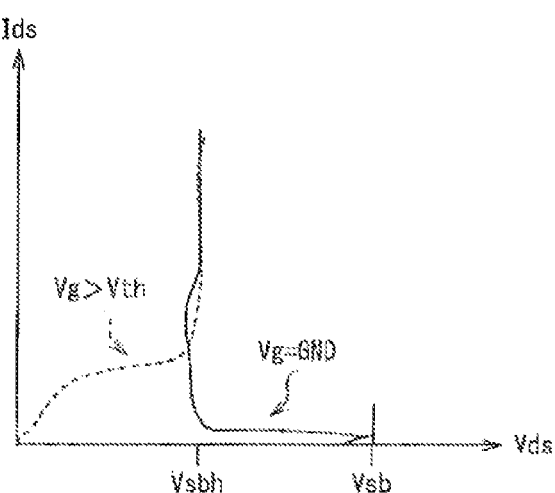
FIG. 5 is a characteristic diagram for explaining a writing method in the memory cell illustrated in FIG. 4.

In the operation of writing to this memory element 101, first, a voltage equal to or higher than a predetermined threshold voltage Vth is applied to the gate of each of the memory element 101 and the selection transistor 102, which are then both set to be in an ON state (gate voltage Vg of memory element 101>Vth: see FIG. 5). Subsequently, a voltage not exceeding the withstand voltage of each of the memory element 101 and the selection transistor 102 is applied to the bit line BL, thereby setting a state in which an electric current flows to each of the memory element 101 and the selection transistor 102. Subsequently, the gate voltage Vg of the memory element 101 is lowered (to, for example, Vg=electric potential of ground GND: see FIG. 5), and the memory element 101 is set in a snapback mode. This causes a flow of a large current between the source and the drain of the memory element 101 as described above, and thereby a PN junction is destroyed, resulting in a short between the source and the drain (short-circuited). In other words, in this memory element 101, in a manner similar to a typical anti-fuse type OTP element, a state between both electrodes (the source and the drain) is changed from an open state to a short state, and thereby the operation of writing information is performed.

However, in the operation of writing in this comparative example, the large current flowing at the time of the snapback phenomenon destroys the PN junction and thus, the large current also flows into the selection transistor 102. Here, in this technique as described above, a shift from the state (the ON state) in which the electric current flows in both of the memory element 101 and the selection transistor 102 to the snapback mode is caused by reducing the gate voltage Vg of the memory element 101, and thereby the large current is caused to flow. For this reason, there is a concern that when a resistance value of the selection transistor 102 in the first ON state is large, the voltage between both ends (the source and the drain) of the memory element 101 falls due to a voltage drop. Therefore, in the selection transistor 102, it is desirable to lower the resistance value by, for example, setting a large width (gate width) of a channel region. This leads to an increase in the element size of the selection transistor 102.

In addition, this selection transistor 102 is also used to select the memory element 101 targeted for reading at the time of the operation of reading after the operation of writing and thus, destruction of the selection transistor 102 at the time of the operation of writing is not acceptable. Therefore, in the selection transistor 102, a current capability high enough to pass an electric current flowing at the time of the operation of writing in the ON state is desired, and this also makes it preferable to render the element size of the selection transistor 102 larger than the memory element 101.

Therefore, in the memory element 101 of the comparative example, although it is possible to form the memory element 101 of substantially the same element size as an ordinary MOS transistor, the selection transistor 102 to be used as being paired with this memory element 101 is of an element size larger than the memory element 101. As a result, the memory cell 100 per bit as a whole leads to an increase in element area.

In this way, in the technique of the operation of writing in the typical OTP element including the memory element 101 of this comparative example, it is difficult to reduce the area of the memory device (semiconductor device).

(2-2. Operation of Writing in Embodiment)

In contrast, in the memory device 1 of the present embodiment, the operation of writing the information to the memory element 21 in the memory cell 20 is performed in the word-line driving section 31 and the bit-line driving section/sense amplifier 32, as illustrated in FIG. 2, FIG. 3A, and FIG. 3B.

In other words, the word-line driving section 31 and the bit-line driving section/sense amplifier 32 apply the voltage V1 equal to or higher than the predetermined threshold, between the electrodes 215B and 215C, for the memory element 21 to be driven among the memory elements 21 in the memory array 2. Here, the voltage of this predetermined threshold is a voltage by which the filament 210 described above is formed in the memory element 21 (in other words, a voltage equal to or higher than the dielectric breakdown withstand voltage in the dielectric film 216), and is, for example, around a few V to 20 V. Further, detailed voltage setting for the memory element 21 targeted for the operation of writing at this moment is, for example, as follows. That is, first, each of the semiconductor layer 211P and the semiconductor layer 212N (the electrode 215A) is set at, for example, a ground potential (the electric potential of the ground GND). However, each of the semiconductor layer 211P and the semiconductor layer 212N (the electrode 215A) may be set in a floating state. Further, in conjunction with that, the conductive film 217 (the electrode 215C) is set at a predetermined electric potential to prevent an inversion layer from being formed between the semiconductor layers 212N and 213N in the semiconductor layer 211P. Here, the predetermined electric potential at which this conductive film 217 is set corresponds to a negative potential in, for example, a case of indicating an enhancement characteristic when the memory element 21 is assumed to be an N-type MOS transistor. Then, under such a condition, the voltage V1 equal to or higher than the threshold is applied between the electrodes 215B and 215C as described above. It is to be noted that the voltage to be applied to the electrode 215B (the semiconductor layer 213N) at this moment may not be equal to or higher than the isolation withstand voltage of the semiconductor layers 212N and 213N.

Thus, in the memory element 21 targeted for the operation of writing, a dielectric breakdown of at least a part of the dielectric film 216 (for example, a part of a region on the semiconductor layer 213N side) is caused to allow a flow of an electric current between the conductive film 216 and the semiconductor layer 213N. As a result, as illustrated in FIG. 3B, between the semiconductor layers 212N and 213N, the filament 210 which is a conductive path electrically linking those semiconductor layers (the electrodes 215A and 215B) is formed.

Here, this filament 210 is assumed to be formed on the following principle. That is, first, when the voltage V1 mentioned above is applied between the electrodes 215B and 215C of the memory element 21, a dielectric breakdown occurs in at least a part of the dielectric film 216. Then, an electric current drastically flows between the conductive film 217 and the semiconductor layer 213N. Here, the dielectric breakdown of this dielectric film 216 occurs mainly on the semiconductor layer 213N side where electric field intensity becomes relatively high. However, since the interfacial state, film thickness, and shape of the dielectric film 216 are not completely uniform, the dielectric breakdown does not occur uniformly on the whole, and occurs in a local region where a breakdown voltage is relatively low. Therefore, at the time of the dielectric breakdown of the dielectric film 216, the above-described electric current flows locally, thereby resulting in a large current density, which is accompanied by large heat generation, and great damage to a semiconductor crystal (for example, a silicon crystal) occurs in a lower region of the dielectric film 216 in the semiconductor layer 211P. Further, starting from a leak path caused by this damage, also having an influence of a rise in neighborhood temperature due to the heat generation, an electric current momentarily flows between these semiconductor layers by a potential difference between the semiconductor layers 212N and 213N, causing destruction of junction. Then, by migration due to heat resulting from the heat caused by the electric current flowing at this moment, one or both of the conductive component of the electrode 215A and the conductive component of the electrode 215B are moved into the semiconductor layer 211P, and it is conceivable that this may result in the formation of the filament 210.

In this way, in the memory device 1 of the present embodiment, the memory element 21 in which the above-described operation of writing is not performed (information is not written) is open (in an open state) in which the semiconductor layers 212N and 213N are electrically separated from each other, as illustrated in FIG. 3A. On the other hand, the memory element 21 after the above-described operation of writing is performed (information is written) is in a state (a short state) in which the semiconductor layers 212N and 213N are electrically connected to each other with a resistance component by the formation of the filament 210, as illustrated in FIG. 3B. Further, in conjunction with that, in the memory element 21 after the operation of writing, the dielectric breakdown of at least a part of the dielectric film 216 is caused as described above. In this way, the memory element 21 may be caused to function as an anti-fuse type OTP element.

It is to be noted that in "the open state" before the above-described operation of writing, actually, a fine leakage current flows and thus, strictly speaking, a complete opening state is not established. However, between the state before the operation of writing (before the filament 210 is formed) and the state after the operation of writing (after the filament 210 is formed), a difference in electric current flowing between the semiconductor layers 212N and 213N is large and thus, these states before and after the operation of writing may be detected by being distinguished from each other.

In such operation of writing in the present embodiment, unlike the technique in the typical OTP element including the above-described comparative example, the operation of writing is realized without allowing the memory element to have a high withstand voltage or causing a flow of a large current at the time of the operation of writing. This will be described below in detail.

First, at the time of this operation of writing, after a predetermined word potential is applied to the gate of the selection transistor 22 and thereby making the selection transistor 22 be in the ON state as described above, a voltage equal to or higher than a predetermined value (the voltage for the operation of writing) is applied to the bit line BL. At this moment, although the selection transistor 22 is in the ON state, only an electric current on the same level as a leakage current flows, and thus, it is possible to virtually ignore a voltage drop in the selection transistor 22. For this reason, a potential difference (voltage) between the voltage applied to the bit line BL and the electric potential of the ground GND (ground potential) is applied approximately as it is between both ends (between the electrodes 215A and 215B) of the memory element 21. Subsequently, the following may be said once the voltage applied to the bit line BL is set to be equal to or lower than the withstand voltage of the selection transistor 22, and the voltage V1 between the electrodes 215B and 215C desirable for forming the filament 210 is adjusted by the electric potential of the electrode 215C (the gate potential Vg of the memory element 21). That is, at the time of the operation of writing, only the voltage equal to or lower than the withstand voltage of the transistor is applied to the selection transistor 22 which is also used at the time of the operation of reading and thus, the operation of writing to the memory element 21 may be performed without destroying this selection transistor 22. This means that the MOS transistor obtained by the process of forming the memory element 21 may be used as the selection transistor 22, without separately providing a transistor with a high withstand voltage for the operation of writing to the memory element 21.

In this way, in the memory element 21 of the present embodiment, it is possible to realize the OTP element having a small element area on the same level as a typical MOS transistor and thus, an OTP element having a small area as compared with a typical OTP element may be realized, which is advantageous particularly when the bit count is large. In addition, the memory element 21 is formed within a process range of a typical CMOS (Complementary Metal Oxide Semiconductor) process and thus, it is also advantageous to a great extent in terms of wafer cost.

As described above, in the present embodiment, in the word-line driving section 31 and the bit-line driving section/sense amplifier 32, the voltage V1 equal to or higher than the predetermined threshold is applied between the electrodes 215B and 215C, for the memory element 21 to be driven among the memory elements 21 in the memory array 2, and thereby the dielectric breakdown of at least a part of the dielectric film 216 is caused to allow the electric current to flow between the conductive film 217 and the semiconductor layer 213N. As a result, the filament 210 is formed in the region between the semiconductor layers 212N and 213N, and thereby the operation of writing information is performed. This makes it possible to realize the operation of writing, without allowing the memory element 21 to have a high withstand voltage or causing a flow of a large current at the time of the operation of writing. Therefore, the area in the memory device 1 (semiconductor device) may be decreased and also, production cost may be reduced.

It is to be noted that in the present embodiment (and each of the following modifications), it is desirable that the width (the length in a direction straddling the semiconductor layers 212N and 213N) of the conductive film 217, corresponding to the gate of the MOS transistor in the memory element 21, be longer than a gate length L of the selection transistor 22 formed of the MOS transistor. The reason for this is that this makes it possible to put the isolation withstand voltage between the semiconductor layers 212N and 213N in a downward direction, and as a result, it is possible to suppress the voltage in the operation of writing into the memory element 21 to a low level, making the formation of the filament 210 easy.

(Modifications)

Next, the modifications (the modifications 1 to 3) of the embodiment described above will be described. It is to be noted that the same elements as those in the embodiment will be provided with the same reference characters as those in the embodiment, and the description will be omitted as appropriate.

[Modification 1]

FIGS. 6A and 6B each schematically illustrate an example of a cross-sectional configuration of a memory element (a memory element 21A) according to the modification 1, and illustrate the example of the cross-sectional configuration before operation of writing and the example of the cross-sectional configuration after the operation of writing, respectively. The memory element 21A of the present modification is formed by providing silicide layers 212S and 213S within the semiconductor layers 212N and 213N, respectively, in the memory element 21 of the embodiment illustrated in FIGS. 3A and 3B, and is otherwise similar in configuration to the memory element 21.

The silicide layer 212S is provided in a semiconductor layer 212N, and the silicide layer 213S is provided in a semiconductor layer 213N. These silicide layers 212S and 213S may be each made of, for example, silicide metal such as CoSi and NiSi (silicide using refractory metal), and may be formed using a typical silicide forming process.

In the present modification, basically, it is also possible to obtain similar effects by similar operation to those of the embodiment described above. However, in the present modification, at least one of a conductive component of an electrode 215A, a conductive component of an electrode 215B, and a conductive component of the silicide layers 212S and 213S moves into a semiconductor layer 211P due to migration, and thereby a filament 210 is formed.

[Example]

Here, there will be described an example of a memory device using the memory element 21A of the present modification, with reference to FIG. 7 to FIG. 9.

First, FIG. 7 illustrates an example of electrical characteristics (a characteristic indicating a relationship between interterminal current and interterminal voltage) of the memory element 21A, before and after the operation of writing. It is to be noted that the word "interterminal" here means "between the electrodes 215A and 215B (between the semiconductor layers 212N and 213N)". It is found from this FIG. 7 that the memory element 21A before the operation of writing exhibits a characteristic in which almost no electric current flows between the terminals even when a voltage is applied between the terminals, but the operation of writing causes the memory element 21A to exhibit a resistive characteristic in which an electric current flows between the terminals in response to application of the interterminal voltage.

Figure 8A:
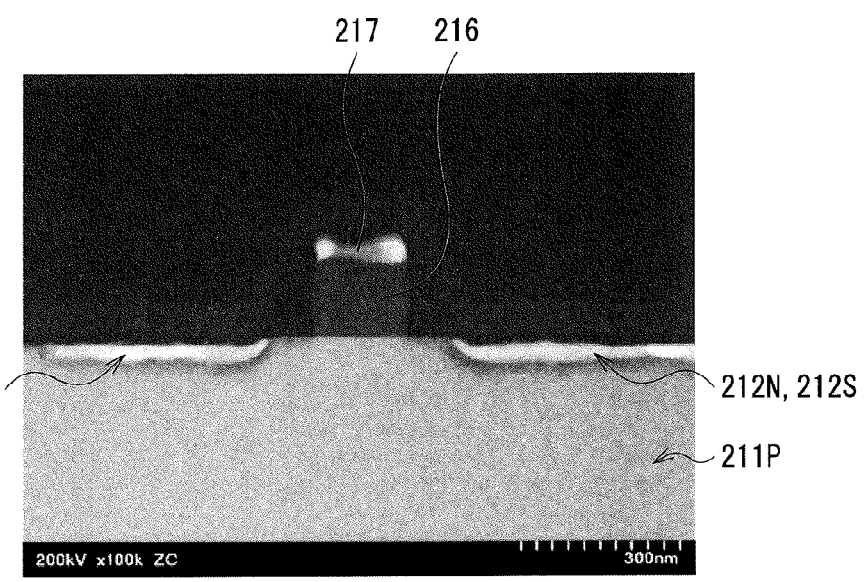
FIGS. 8A and 8B are diagrams illustrating cross-sectional photographs of states before and after the operation of writing in the memory element according to the example, respectively.
Figure 8B:
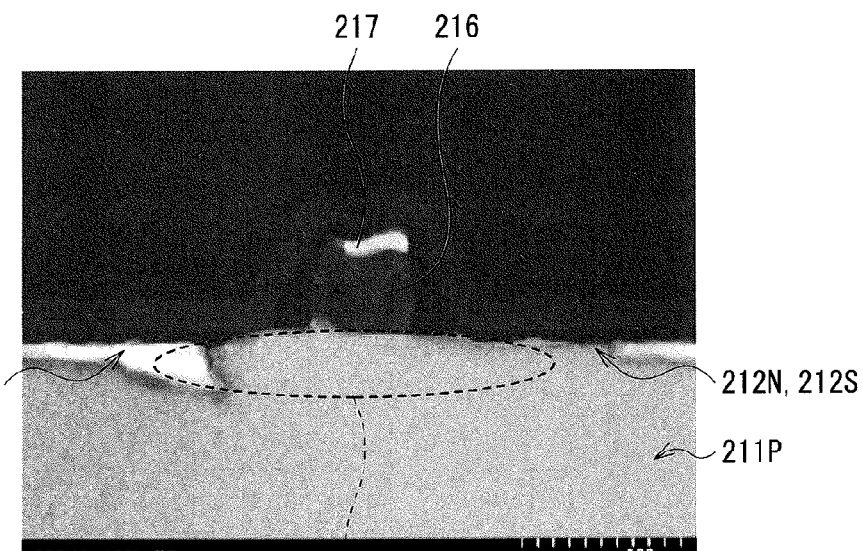
Figure 9:
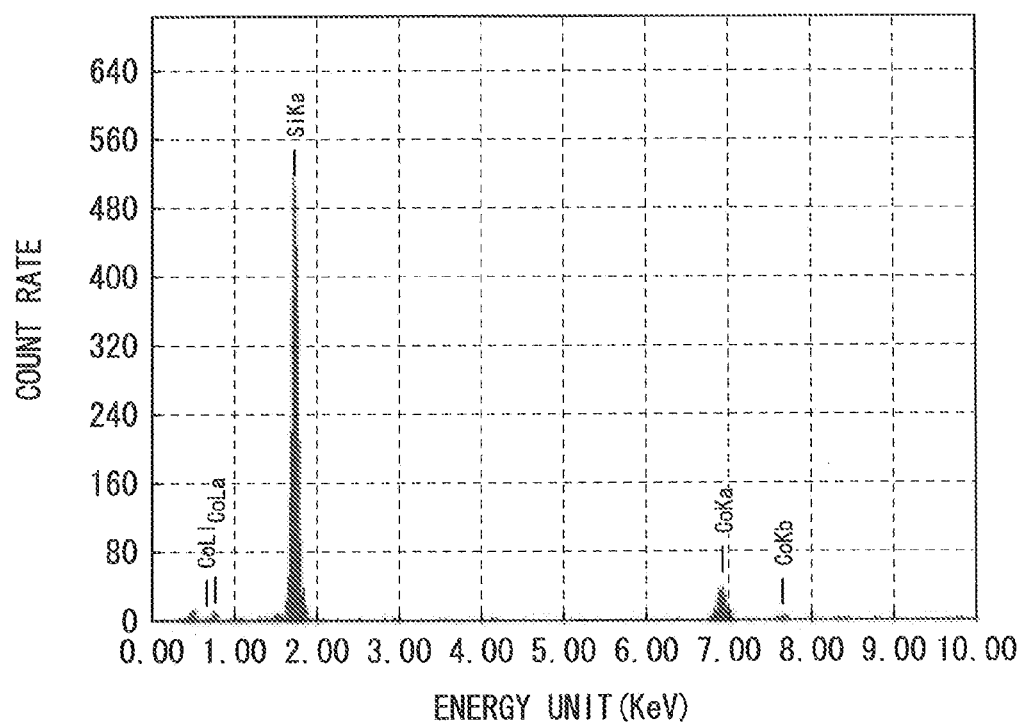
FIG. 9 is a characteristic diagram illustrating an example of an elemental analysis result in a region between electrodes of the memory element after the operation of writing illustrated in FIG. 8B.

Further, FIGS. 8A and 8B illustrate examples of cross-sectional photographs (photographs taken by TEM: Transmission Electron Microscope) of states before and after the operation of writing in the memory element 21A, respectively. From these FIGS. 8A and 8B, it is apparent that the filament 210 is formed between the semiconductor layers 212N and 213N by the operation of writing. Based on an example of an elemental analysis result (a result of analysis by EDX: Energy Dispersive X-ray spectrometry) in a region between the electrodes of the memory element 21A illustrated in FIG. 9, the following may be said. That is, at least one of the conductive component of the electrode 215A, the conductive component of the electrode 215B, and the conductive component of the silicide layers 212S and 213S is detected between the semiconductor layers 212N and 213N after the operation of writing. It is to be noted that here, as an example, an elemental component of cobalt (Co) is detected in a peak waveform illustrated in FIG. 9. As a result, there is actually confirmed the fact that the conductive component of the member mentioned above is moved into the semiconductor layer 211P by the migration and thereby the filament 210 is formed.

[Modification 2]

Figure 10:
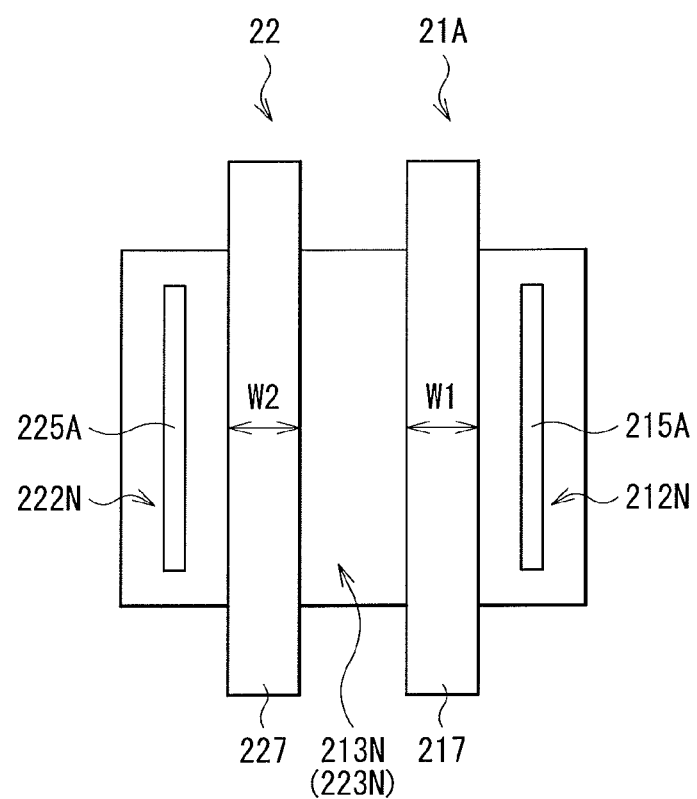
FIG. 10 is a schematic plan view illustrating an example of an outline configuration of a memory element and a selection transistor according to a modification 2.
Figure 11A:
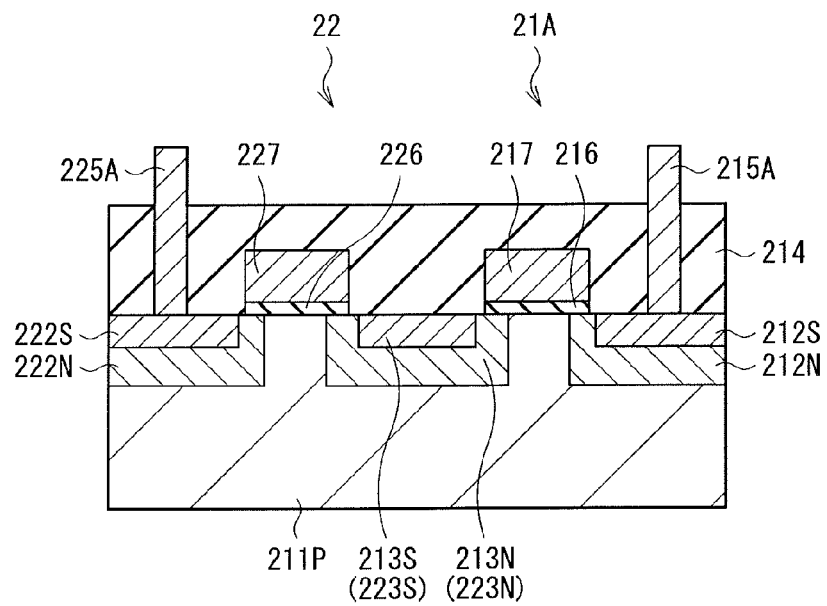
FIGS. 11A and 11B are schematic cross-sectional diagrams each illustrating a configurational example of the memory element and the selection transistor (before and after operation of writing) illustrated in FIG. 10.
Figure 11B:
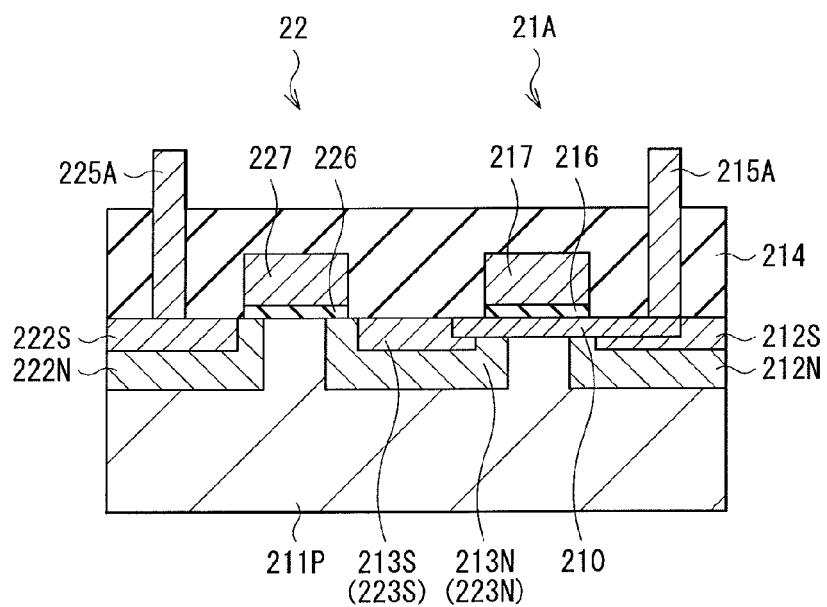

FIG. 10 schematically illustrates an example of a plane configuration of a memory element 21A and a selection transistor 22 according to a modification 2. Further, FIGS. 11A and 11B each schematically illustrate an example of a cross-sectional configuration of the memory element 21A and the selection transistor 22, and illustrate the example of the cross-sectional configuration before operation of writing and the example of the cross-sectional configuration after the operation of writing, respectively. In the present modification, as will be described below, the memory element 21A and the selection transistor 22 are formed integrally in the same activated region (an active region) in a memory cell 20.

Specifically, here, three N-type semiconductor layers 212N, 213N (223N), and 222N are formed in a P-type semiconductor layer 211P. Further, silicide layers 212S, 213S, and 222S are formed in these semiconductor layers 212N, 213N (223N), and 222N, respectively. In a region corresponding to a part between the semiconductor layers 212N and 213N on the semiconductor layer 211P, the dielectric film 216 and the conductive film 217 described above are formed in this order. Furthermore, likewise, in a region corresponding to a part between the semiconductor layers 213N and 222N on the semiconductor layer 211P, a dielectric film 226 and a conductive film 227 corresponding to a gate insulator and a gate electrode of the selection transistor 22 are formed in this order. On the semiconductor layer 212N (and the silicide layer 212S), an electrode 215A electrically connected thereto is formed, and on the semiconductor layer 222N (and the silicide layer 222S), an electrode 225A electrically connected thereto is formed. In addition, an electrode 215C (not illustrated) electrically connected to the conductive film 217 is formed, and an electrode 225C (not illustrated) electrically connected to the conductive film 227 is formed. In this way, in the memory element 21A and the selection transistor 22 of the present modification, because of the integral formation in the activated region, the gates thereof (the conductive films 217 and 227) are disposed in parallel. In other words, in the memory element 21A and the selection transistor 22, the dielectric films 216 and 226 as well as the conductive films 217 and 227 have structures in common (the same structures). In addition, although not illustrated here, the structures of the memory element 21A and the selection transistor 22 are also common with (identical to) the structures of other MOS transistors within a circuit in the memory device 1.

It is to be noted that W1 illustrated in FIG. 10 indicates the width of the conductive film 217, and W2 indicates the width (corresponding to a gate length L of the selection transistor 22) of the conductive film 227 (here, a direction in which an electric current flows is defined as the width of the conductive film). In this case likewise, as described above, it may be said that the width W1 of the conductive film 217 in the memory element 21A is desirably smaller than the width W2 (gate length L) of the conductive film 227 in the selection transistor 22.

In this way, in the present modification, the memory element 21A and the selection transistor 22 are integrally formed in the same activated region and thereby the gates thereof are disposed in parallel, and therefore, it is possible to obtain the following effect in addition to the effects in the above-described embodiment. That is, the memory cell 20 including the selection transistor 22 and the memory element 21A may be realized as having an area substantially as small as an MOS transistor having two gates, and in particular, even when the bit count is large, a peripheral circuit having a small area may be implemented.

It is to be noted that in the present modification, there has been described the case in which the memory element 21A and the selection transistor 22 are formed integrally in the same activated region. However, for example, the earlier-described memory element 21 and the selection transistor 22 may be formed integrally in the same activated region.

[Modification 3]

Figure 12:
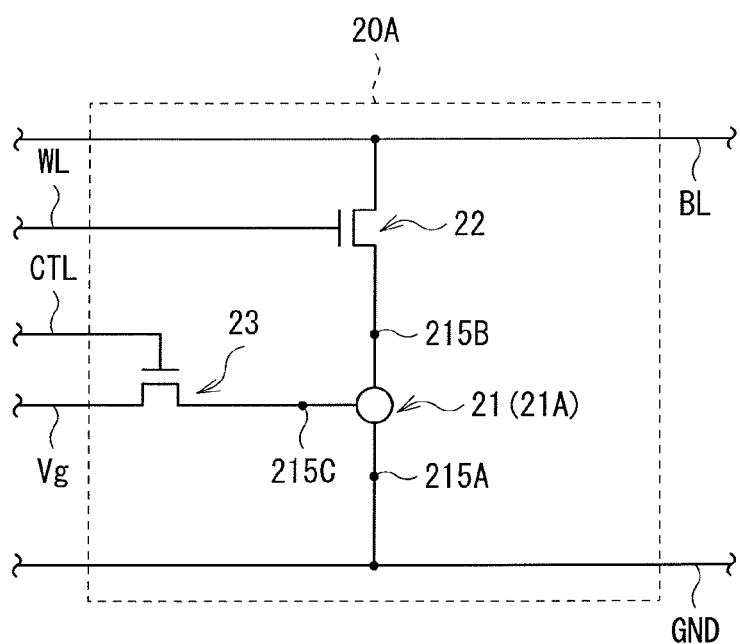
FIG. 12 is a circuit diagram illustrating a configurational example of a memory cell according to a modification 3.

FIG. 12 illustrates an example of a circuit configuration of a memory cell (a memory cell 20A) according to a modification 3. The memory cell 20A of the present modification has one memory element 21 (or a memory element 21A), one selection transistor 22, and one control transistor 23. In other words, this memory cell 20A is formed by further providing the control transistor 23 to be described below in the memory cell 20 of the embodiment described above, and is otherwise similar in configuration to the memory cell 20.

The control transistor 23 is a transistor controlling a conductive film potential (an electric potential of an electrode 215C) of the memory element 21 (or the memory element 21A), and is configured by using an MOS transistor here. In this control transistor 23, a gate is connected to a predetermined control signal line CTL, and one of a source and a drain is connected to the electrode 215C in the memory element 21 (or the memory element 21A). Further, the other of the source and the drain in the control transistor 23 is set at a predetermined electric potential (a gate potential Vg).

In the memory cell 20A of the present modification, at the time of operation of writing, the control transistor 23 is made to be in an ON state through the control by the control signal line CTL, and thereby a conductive film 217 in the memory element 21 (or the memory element 21A) targeted for the operation of writing is set at the predetermined gate potential Vg. On the other hand, at the time other than the operation of writing, the control transistor 23 is made to be in an OFF state through the control by the control signal line CTL, and thereby the conductive film 217 is set to be in a no-voltage-applied state (a floating state). Incidentally, when this control transistor 23 is in the OFF state, the conductive film 217 may not be set in the floating state, and may be set to have a predetermined electric potential to be applied thereto. It is to be noted that "the time other than the operation of writing" mentioned here does not include the time when a circuit of a memory device is not in operation (the time when neither operation of reading nor operation of writing is performed for the memory element).

This, in the present modification, makes it possible to avoid the following disadvantage. That is, first, at the time of the operation of writing described so far, the breakdown of the dielectric film 216 takes place and thus, there is a concern that the conductive film 217 and the semiconductor layer 211P thereunder are electrically connected. When the conductive film 217 and the semiconductor layer 211P are thus electrically connected with a low resistance component, an unexpected current path is produced in the memory array 2, and at the time such as when the operation of writing is performed for other memory cell 20 in the memory array 2, a peripheral circuit may not perform desired operation. Therefore, as in the present modification, in such a configuration that the control transistor 23 is set to be in the ON state only at the time of the operation of writing, and a voltage is applied to the conductive film 217 of the memory element 21 (or the memory element 21A) while not being applied to the conductive film 217 at other times, a decline in yield of products caused by the unexpected current path mentioned above may be suppressed, thereby making it possible to improve reliability.

[Other Modifications]

The present technology has been described by taking the embodiment and modifications, but the present technology is not limited to the embodiment and the like and may be variously modified.

For example, there is no limitation to the material of each layer described in the embodiment and the like described above, and other materials may be employed. Further, in the embodiment and the like, the configurations of the memory elements, memory cells and memory devices have been described specifically, but all the layers may not be provided, and other layers may be further provided.

Furthermore, in each of the embodiment and the like, there has been described the case in which between the bit line BL and the ground GND, the selection transistor 22 on the bit line BL side and the memory element 21 or 21A on the ground GND side are connected to each other in series, but the circuit configuration of the memory cell is not limited to this case. In other words, in contrast, the selection transistor 22 on the ground GND side and the memory element 21 or 21A on the bit line BL side may be connected to each other in series.

Moreover, in each of the embodiment and the like, there has been described the case in which the semiconductor layer 211P is a P-type semiconductor layer and the semiconductor layers 212N, 213N, 222N, and 223N are N-type semiconductor layers. However, the conductivity types (P-type and N-type) in these semiconductor layers may be reversed.

In addition, in each of the embodiment and the like, there has been described the case in which more than one memory element is provided in the memory device, but only one memory element may be provided, without being limited to this case.

Further, in each of the embodiment and the like, the memory device has been described as an example of the semiconductor device of the present technology. However, the semiconductor device may be configured by using a semiconductor integrated circuit including other elements (for example, a transistor, a capacitor, a resistance element, and the like) in addition to such a memory device.

The present disclosure contains subject matter related to that disclosed in Japanese Priority Patent Application JP 2011-34796 filed in the Japan Patent Office on Feb. 21, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A method comprising:
providing one or more memory elements each including (1) a first semiconductor layer of a first conductivity type, (2) second and third semiconductor layers of a second conductivity type, which are disposed separated from each other in the first semiconductor layer, (3) a dielectric film on a lower-layer side and a conductive film on an upper-layer side, which are provided in a region corresponding to a portion between the second and third semiconductor layers on the first semiconductor layer, (4) a first electrode electrically connected to the second semiconductor layer, (5) a second electrode elec- trically connected to the third semiconductor layer, (6) and a third electrode electrically connected to the conductive film; and performing a write operation on at least one of the memory elements by
(a) applying to each memory element on which a write operation is performed a voltage equal to or higher than a predetermined threshold between the second and third electrodes, thereby causing an electric current to flow between the conductive film and the third semiconductor layer and causing a dielectric breakdown of a least a portion of the dielectric film; and
(b) forming in each memory element on which a write operation is performed a filament in the portion between the second and third semiconductor layers, the filament being a conductive path between the second and third semiconductor layers.

2. The method according to claim 1, comprising, for each memory element on which a write operation is performed, while applying the voltage equal to or higher than the threshold between the second and third electrodes, setting each of the first and second semiconductor layers to a ground potential, and setting the conductive film at a predetermined potential to avoid formation of an inversion layer between the second and third semiconductor layers in the first semiconductor layer.

3. The method according to claim 2, comprising, for each memory element on which the write operation is performed:
at a time of performing the write operation, placing a predetermined control transistor in an ON state, thereby setting the conductive film in the memory element to be driven at the predetermined potential, and
at a time other than the time of the operation of writing, the control transistor is set in an OFF state.

4. The method according to claim 1, wherein, for each memory element on which a write operation is performed, one or both of a conductive component of the first electrode and a conductive component of the second electrode are caused to migrate to form the filament.

5. The method according to claim 1, comprising:
in each memory element on which the write operation is not performed, the second and third semiconductor layers are left in an open state of being electrically separated from each other, and
in each memory element in which the write operation is performed, after the write operation is performed, the second and third semiconductor layers are in a state of being electrically connected to each other by a resistance component, due to formation of the filament.

6. The method according to claim 1, wherein, for each memory element on which the write operation is performed:
the memory element and one selection transistor are connected to each other in series, and between a bit line and a ground, the bit line supplying the voltage equal to or greater than the threshold; and
the write operation is performed after the memory element to be driven is selected by placing the selection transistor in an ON state.

7. The method according to claim 6, wherein each memory element and its selection transistor are integrally formed in the same activated region.

8. The method according to claim 1, comprising providing a silicide layer in each of the second and third semiconductor layers.

9. The method according to claim 8, comprising causing one or more of a conductive component of the first electrode, a conductive component of the second electrode, and a conductive component of the silicide layer to migrate, and thereby form the filament.

10. A semiconductor device comprising one or more memory elements each including:
a first semiconductor layer of a first conductivity type;
second and third semiconductor layers of a second conductivity type, which are disposed to be separated from each other in the first semiconductor layer;
a dielectric film on a lower-layer side and a conductive film on an upper-layer side, which are provided in a region corresponding to a part between the second and third semiconductor layers on the first semiconductor layer;
a first electrode electrically connected to the second semiconductor layer;
a second electrode electrically connected to the third semiconductor layer; and
a third electrode electrically connected to the conductive film,
wherein, each memory is such that:
application of a voltage at or above a predetermined threshold between the second and third semiconductor layers causes a dielectric breakdown of at least a part of the dielectric film, and
application of the voltage at or above the threshold between the second and third semiconductor layers causes in a region between the second and third semiconductor layers, a filament to be formed that is a conductive path electrically linking these semiconductor layers.

11. The semiconductor device according to claim 10, further comprising a drive section that performs a write operation for at least one memory element, by forming the filament by causing a dielectric breakdown of at least a part of the dielectric film, via the application of the voltage equal to or higher than the predetermined threshold between the second and third electrodes, thereby causing an electric current to flow between the conductive film and the third semiconductor layer.

12. The semiconductor device according to claim 10, further comprising a respective selection transistor associated with each memory element to which is applied the voltage at or above the predetermined threshold, the memory element and the selection transistor being integrally formed in the same activated region.

* * * * *